（12） United States Patent
Ohashi et al.

(10) Patent No.: US 12,327,755 B2
(45) Date of Patent: Jun. 10, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Naofumi Ohashi, Toyama (JP); Toshiyuki Kikuchi, Toyama (JP); Tadashi Takasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 675 days.

(21) Appl. No.: 17/479,436

(22) Filed: Sep. 20, 2021

(65) Prior Publication Data

US 2022/0093447 A1    Mar. 24, 2022

(30) Foreign Application Priority Data

Sep. 24, 2020   (JP) ................................. 2020-159458

(51) Int. Cl.
*H01L 21/687*    (2006.01)
*C23C 16/455*    (2006.01)

(52) U.S. Cl.
CPC .. *H01L 21/68771* (2013.01); *C23C 16/45521* (2013.01); *H01L 21/68764* (2013.01)

(58) Field of Classification Search
CPC ........... H01L 21/68771; H01L 21/0217; H01L 21/67069; H01L 21/68764;

(Continued)

(56) References Cited

U.S. PATENT DOCUMENTS

2006/0160359 A1    7/2006   Kasai et al.
2010/0122710 A1    5/2010   Kato et al.
(Continued)

FOREIGN PATENT DOCUMENTS

JP    2004-263209 A    9/2004
JP    2010-116606 A    5/2010
(Continued)

OTHER PUBLICATIONS

Japanese Office Action issued on Feb. 8, 2022 for Japanese Patent Application No. 2020-159458.
(Continued)

*Primary Examiner* — Moazzam Hossain
(74) *Attorney, Agent, or Firm* — Volpe Koenig

(57) ABSTRACT

Some embodiments of the present disclosure provide a technique capable of reducing an amount of deposits on a back surface of a rotary table. According to one aspect thereof, there is provided a technique that includes: a process chamber provided with process regions; a rotary table configured to rotate a substrate about a point outside the substrate such that the substrate sequentially passes through the process regions; and a rotator configured to rotate the rotary table, wherein the process regions include: a first region in which a process gas is supplied; and a second region in which an inert gas is supplied, and wherein a space corresponding to the second region below the rotary table is configured such that a pressure at the space corresponding to the second region below the rotary table is higher than a pressure at a space corresponding to the first region below the rotary table.

17 Claims, 9 Drawing Sheets

(58) Field of Classification Search
CPC ......... H01L 21/67103; H01L 21/68742; C23C 16/52; C23C 16/45574; C23C 16/45521; C23C 16/345; C23C 16/4401; C23C 16/4408; C23C 16/45502; C23C 16/45548; C23C 16/45557; C23C 16/45563; C23C 16/45591; C23C 16/4584

See application file for complete search history.

(56) References Cited

U.S. PATENT DOCUMENTS

| | | | |
|---|---|---|---|
| 2011/0159187 A1 | 6/2011 | Kato et al. | |
| 2011/0159702 A1* | 6/2011 | Ohizumi | C23C 16/45551 |
| | | | 438/778 |
| 2014/0287539 A1 | 9/2014 | Ito et al. | |
| 2015/0214029 A1* | 7/2015 | Hane | C23C 16/45519 |
| | | | 438/782 |
| 2017/0232457 A1 | 8/2017 | Fujino et al. | |

FOREIGN PATENT DOCUMENTS

| | | |
|---|---|---|
| JP | 2010-153805 A | 7/2010 |
| JP | 2011-135003 A | 7/2011 |
| JP | 2011-151387 A | 8/2011 |
| JP | 2014-187282 A | 10/2014 |
| JP | 2017-034013 A | 2/2017 |
| JP | 2017-147262 A | 8/2017 |
| TW | 201144469 A | 12/2011 |
| WO | 2016-052333 A1 | 4/2016 |

OTHER PUBLICATIONS

Taiwan Office Action issued on Jul. 7, 2022 for Taiwan Patent Application No. 110134339.

* cited by examiner

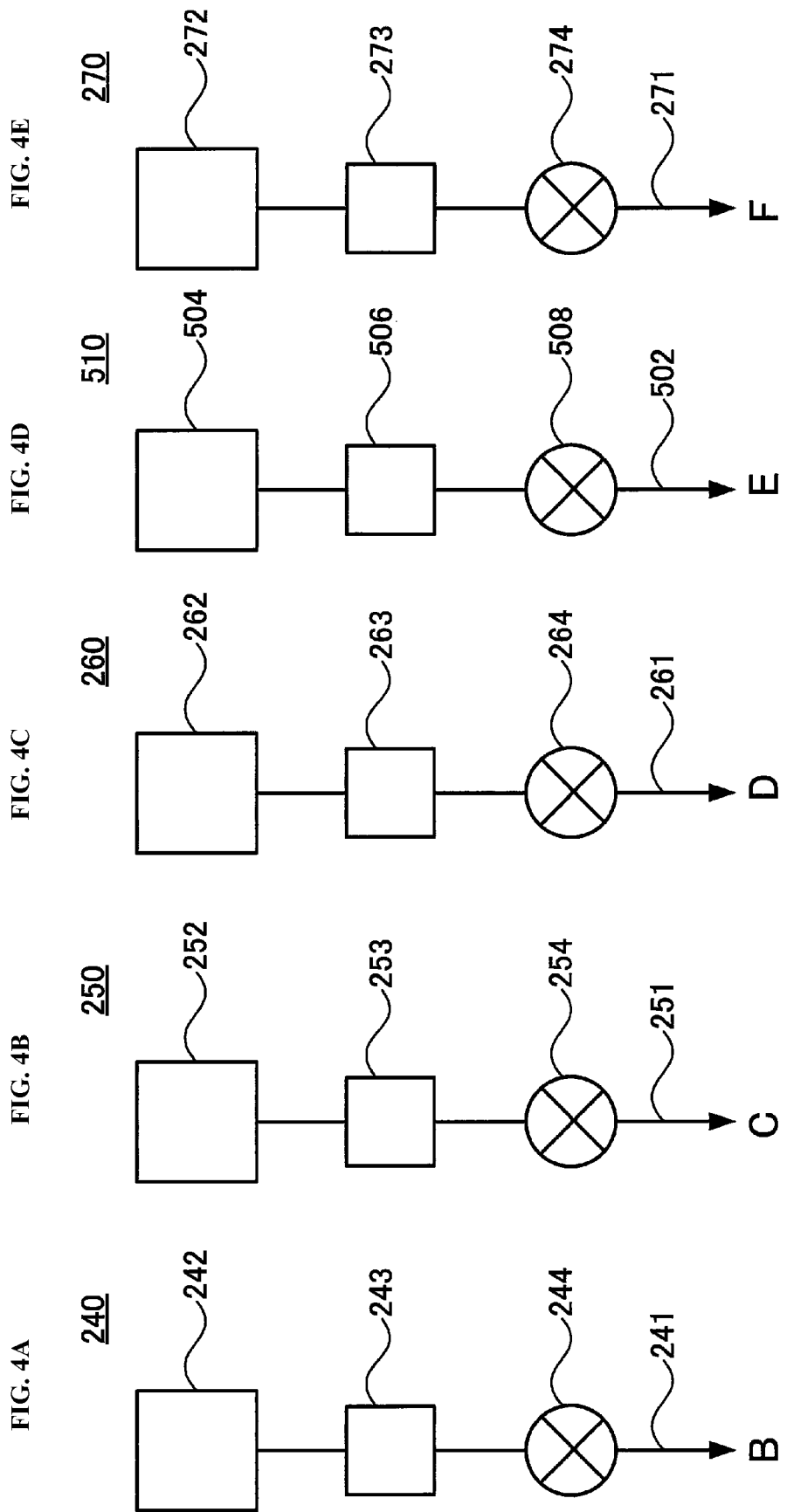

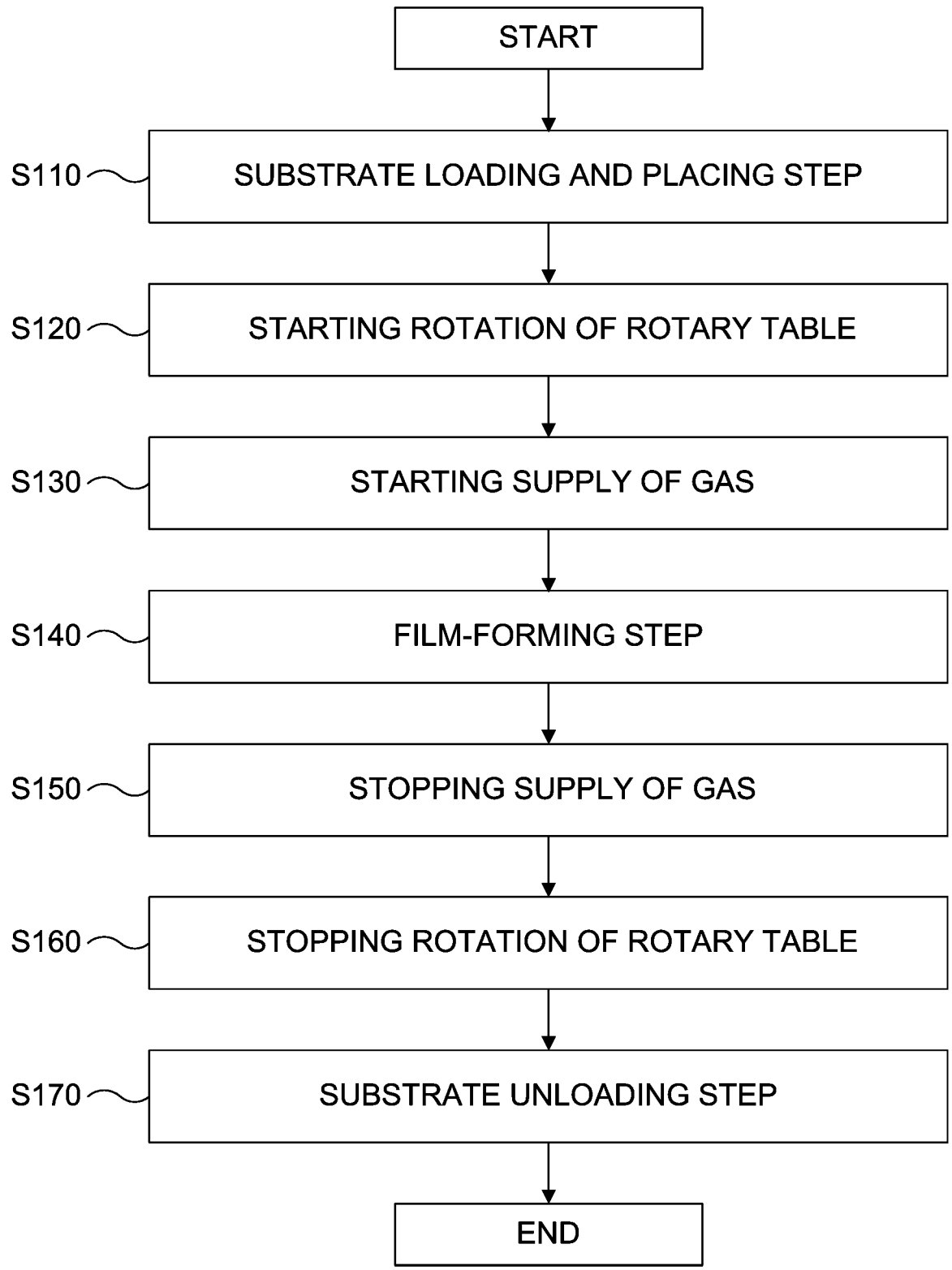

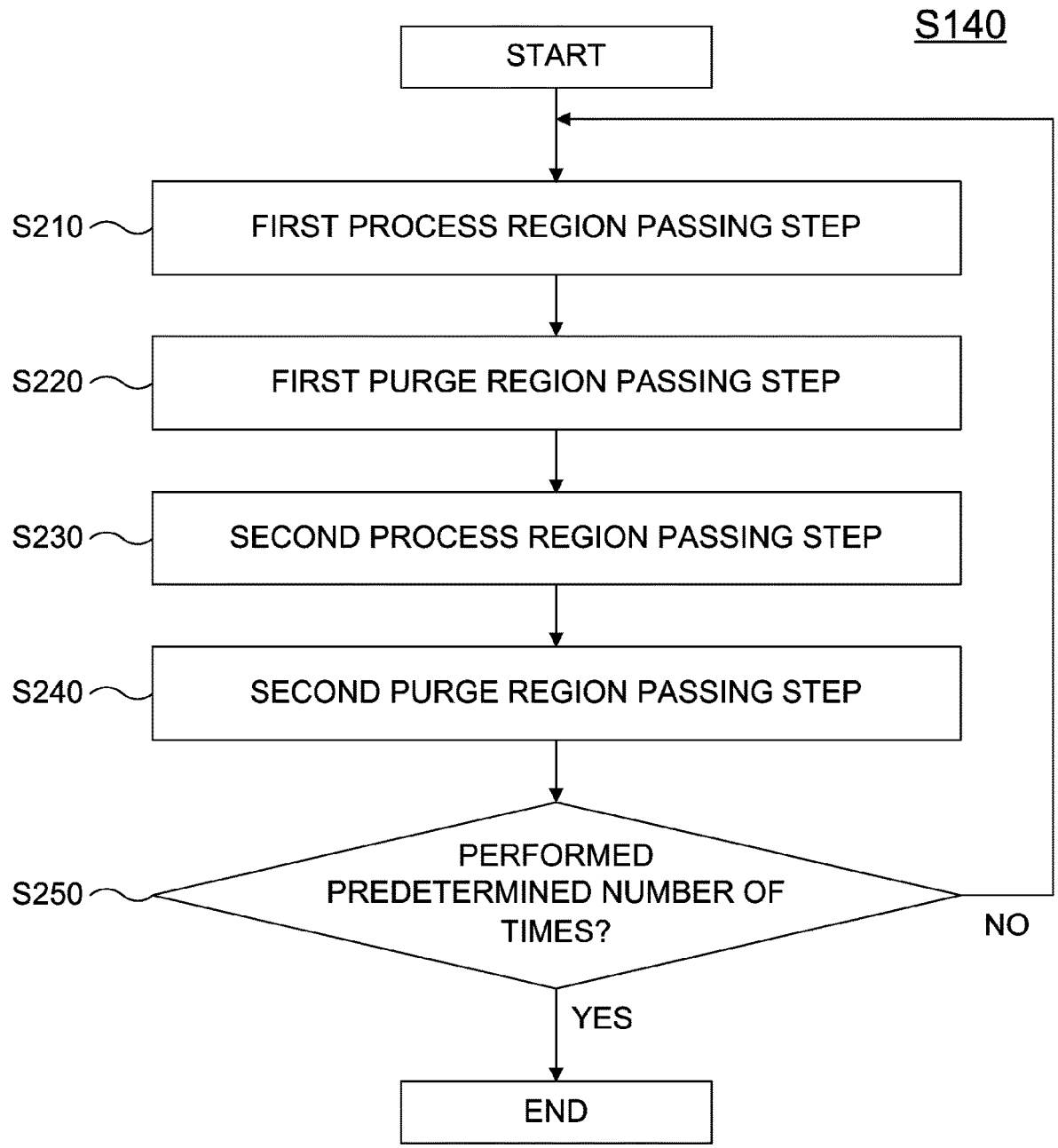

US 12,327,755 B2

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2020-159458, filed on Sep. 24, 2020, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Related Art

As an apparatus of processing a semiconductor substrate, a rotary type apparatus may be used. For example, according to the rotary type apparatus, a plurality of substrates are arranged on a substrate support of the rotary type apparatus along a circumferential direction, and various gases are supplied onto the plurality of substrates by rotating the substrate support. In addition, a vertical type apparatus may also be used. For example, according to the vertical type apparatus, a source gas is supplied onto a plurality of substrates stacked in the vertical type apparatus by using a source gas nozzle extending along a stacking direction of the plurality of substrates stacked in the vertical type apparatus.

In the rotary type apparatus as described above, a precursor may enter a back surface of a rotary table capable of transferring the plurality of substrates by rotating the plurality of substrates, and may be mixed with a reactant. Thereby, deposits may be deposited on the back surface of the rotary table. As a result, particles may be generated.

SUMMARY

Some embodiments of the present disclosure provide a technique capable of reducing an amount of deposits on a back surface of a rotary table.

According to one or more embodiments of the present disclosure, there is provided a technique that includes: a process chamber provided with a plurality of process regions in which a substrate is processed; a rotary table configured to rotate the substrate accommodated in the process chamber about a point located outside the substrate such that the substrate sequentially passes through the plurality of process regions; and a rotator configured to rotate the rotary table, wherein the plurality of process regions include: a first region in which a process gas is supplied to the substrate; and a second region in which an inert gas is supplied to the substrate, and wherein a space corresponding to the second region below the rotary table is configured such that a pressure at the space corresponding to the second region below the rotary table is higher than a pressure at a space corresponding to the first region below the rotary table.

BRIEF DESCRIPTION OF THE DRAWINGS

FIG. 4A is a diagram schematically illustrating a source gas supplier according to the embodiments described herein, FIG. 4B is a diagram schematically illustrating a reactive gas supplier according to the embodiments described herein, FIG. 4C is a diagram schematically illustrating a first inert gas supplier according to the embodiments described herein, FIG. 4D is a diagram schematically illustrating a second inert gas supplier according to the embodiments described herein, and FIG. 4E is a diagram schematically illustrating a third inert gas supplier according to the embodiments described herein.

FIG. 8 is a flow chart schematically illustrating a substrate processing according to the embodiments described herein.

FIG. 9 is a flow chart schematically illustrating a film-forming step of the substrate processing according to the embodiments described herein.

DETAILED DESCRIPTION

Embodiments

Hereinafter, one or more embodiments (hereinafter, simply referred to as "embodiments") according to the technique of the present disclosure will be described with reference to the drawings.

(1) Configuration of Substrate Processing Apparatus

Figure 1:
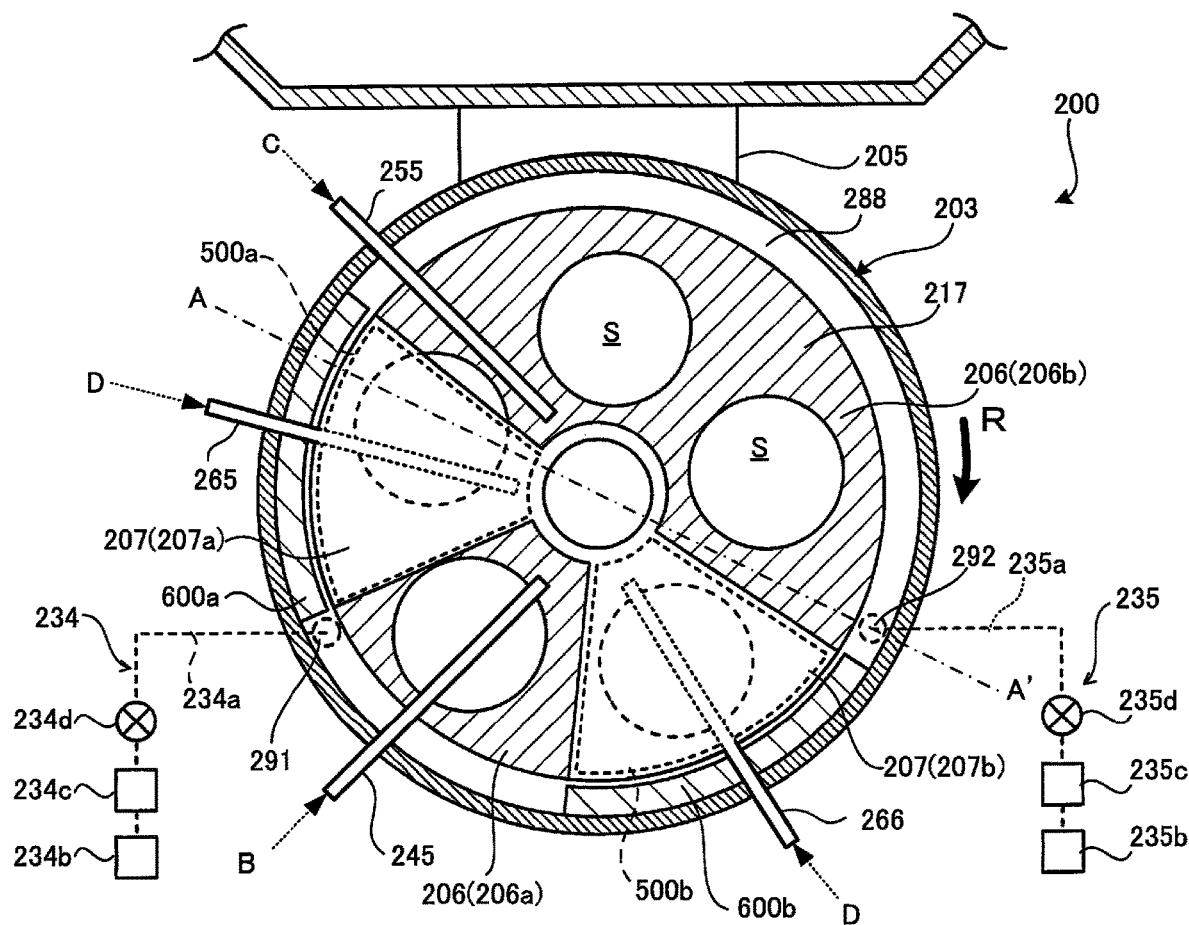
FIG. 1 is a diagram schematically illustrating a horizontal cross-section of a reactor of a substrate processing apparatus according to one or more embodiments described herein.
Figure 2:
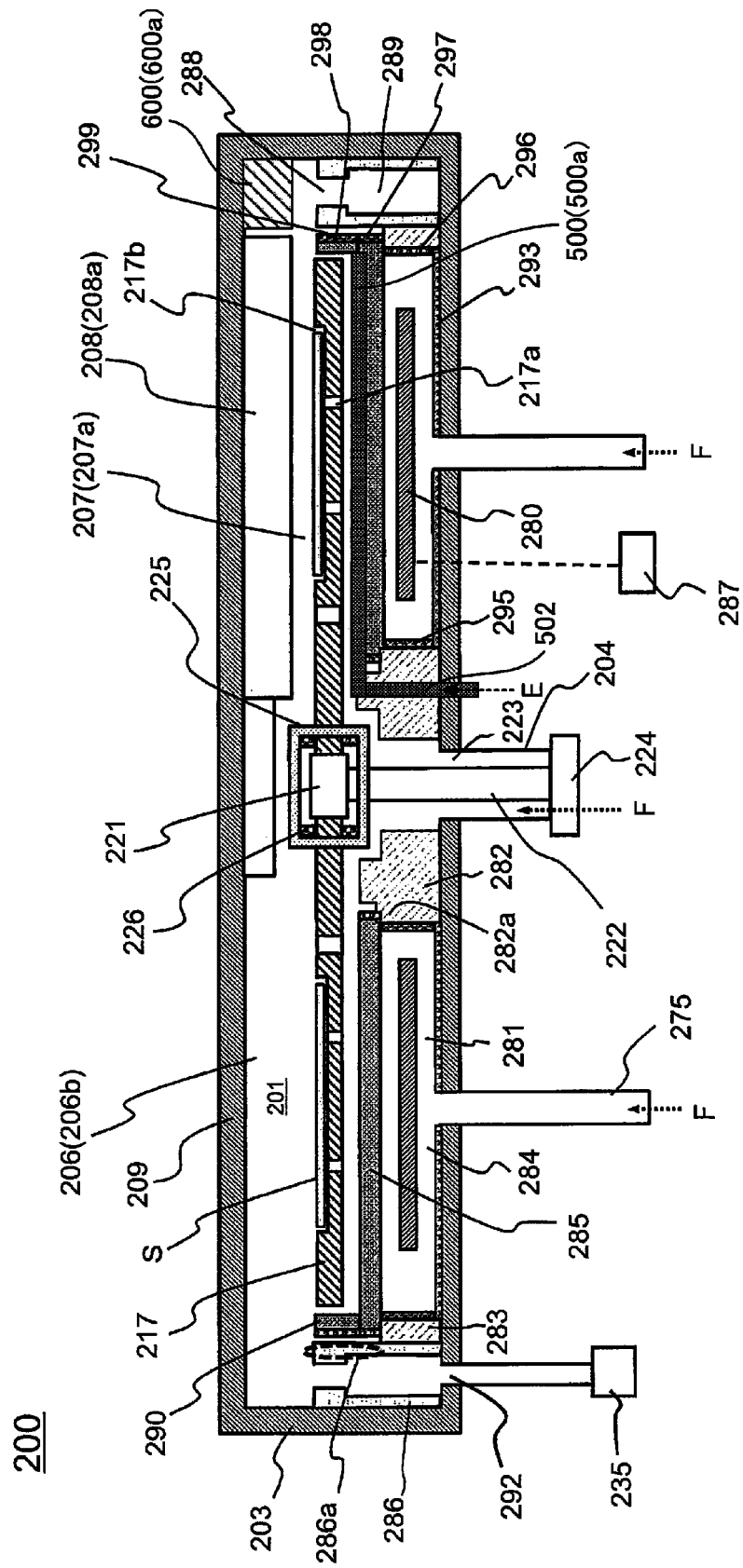
FIG. 2 is a diagram schematically illustrating a vertical cross-section taken along the line A-A' of the reactor shown in FIG. 1 of the substrate processing apparatus according to the embodiments described herein.

As shown in FIGS. 1 and 2, a reactor 200 of a substrate processing apparatus (also referred to a "rotary type apparatus") includes a process vessel 203 which is a cylindrical sealed vessel (hermetic vessel). For example, the process vessel 203 is made of a material such as stainless steel (SUS) and an aluminum alloy. A process chamber 201 in which a plurality of substrates including a substrate S are processed is provided in the process vessel 203. Hereinafter, the plurality of substrates including the substrate S may also be simply referred to as substrates S. A gate valve 205 is connected to the process vessel 203. The substrate S is loaded (transferred) into or unloaded (transferred) out of the process vessel 203 through the gate valve 205. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

The process chamber 201 includes a process region 206 (including a first process region 206a and a second process region 206b) serving as a first region to which a process gas such as a source gas and a reactive gas is supplied and a purge region 207 (including a first purge region 207a and a second purge region 207b) serving as a second region to which an inert gas is supplied. That is, the process vessel 203 includes the process region 206 through which the process gas is supplied to the substrate S and the purge region 207 through which the inert gas is supplied to the substrate S. According to the present embodiments, the process region 206 and the purge region 207 are alternately arranged along a circumferential direction of the process chamber 201. For example, the first process region 206a, the first purge region 207a, the second process region 206b and the second purge region 207b are arranged along the circumferential direction in this order. As described later, for example, the source gas serving as the process gas is supplied into the first process region 206a, the reactive gas serving as the process gas is supplied into the second process region 206b, and the inert gas is supplied into the first purge region 207a and the second purge region 207b. As a result, a predetermined processing (substrate processing) is performed to the substrate S in accordance with the gas supplied into each region.

The first purge region 207a and the second purge region 207b are configured to spatially separate the first process region 206a and the second process region 206b. A ceiling 208 of each of the first purge region 207a and the second purge region 207b is disposed lower than a ceiling (which is a lower surface of a top plate 209) of the process region 206. Specifically, ceilings 208a and 208b are provided at the first purge region 207a and the second purge region 207b at positions facing a rotary table 217, respectively. By lowering each of the ceiling 208a and the ceiling 208b, it is possible to increase a pressure of a space in the first purge region 207a and a pressure of a space in the second purge region 207b. By purging the spaces described above, it is possible to remove excess gases (undesired gases) on the substrate S. By purging the spaces described above, it is also possible to partition the adjacent process region 206 (that is, the first process region 206a and the second process region 206b).

The rotary table 217 configured to be rotatable is provided at a center portion of the process vessel 203. For example, a rotating shaft of the rotary table 217 is provided at a center of the process vessel 203. For example, the rotary table 217 is made of a material such as quartz, carbon and silicon carbide (SiC) such that the substrate S is not affected by the metal contamination.

The rotary table 217 is configured such that the substrates S (for example, five substrates) can be arranged within the process vessel 203 on the same plane and along the same circumference along a rotation direction "R" shown in FIG. 1. In the present specification, the term "the same plane" is not limited to a perfectly identical plane but may also include a case where, for example, the substrates S are arranged so as not to overlap with each other when viewed from above.

A plurality of concave portions 217b serving as supports on which the substrates S are placed are provided on a surface of the rotary table 217 at support positions of the substrates S. respectively. Hereinafter, the plurality of concave portions 217b may also be simply referred to as concave portions 217b. The number of the concave portions 217b is equal to the number of the substrates S to be processed. For example, the concave portions 217b are arranged at the same distance from a center of the rotary table 217, and are arranged along the same circumference at equal intervals (for example, 72° intervals). In FIG. 1, the illustration of the concave portions 217b is omitted for simplification.

Each of the concave portions 217b is of a circular shape when the rotary table 217 is viewed from above and of a concave shape when viewed from a vertical cross-section of the rotary table 217. It is preferable that a diameter of each of the concave portions 217b is slightly greater than a diameter of the substrate S. A substrate placing surface is provided at a bottom of each of the concave portions 217b. For example, the substrate S may be placed on the substrate placing surface by being placed on one of the concave portions 217b. Through-holes 217a penetrated by pins 219 described later are provided at each of the concave portions 217b.

Figure 3:
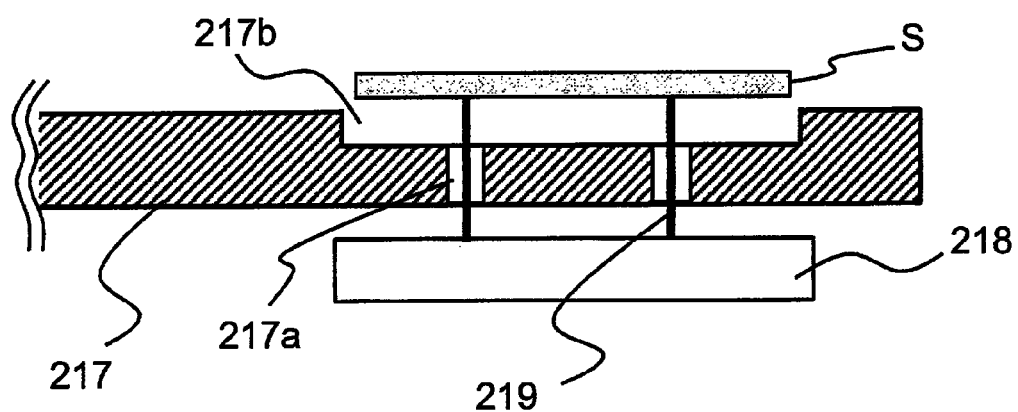
FIG. 3 is a diagram schematically illustrating a substrate support structure according to the embodiments described herein.

A substrate support structure 218 shown in FIG. 3 is provided in the process vessel 203 at a position below the rotary table 217 and facing the gate valve 205. The substrate support structure 218 includes the pins 219 configured to elevate or lower the substrate S and to support a back surface of the substrate S when the substrate S is loaded into or unloaded out of the process chamber 201. The pins 219 may be of an extendable configuration. For example, the pins 219 may be accommodated in a main body of the substrate support structure 218. When the substrate S is transferred, the pins 219 are extended and pass through the through-holes 217a. Thereby, the substrate S is supported by the pins 219. Thereafter, by moving front ends (tips) of the pins 219 downward, the substrate S is placed on one of the concave portions 217b. For example, the substrate support structure 218 is fixed to the process vessel 203. The substrate support structure 218 may be embodied by any configuration as long as the pins 219 can be inserted into the through-holes 217a when the substrate S is placed, and may also be fixed to an inner peripheral convex portion 282 or an outer peripheral convex portion 283 described later.

The rotary table 217 is fixed to a core portion 221. The core portion 221 is provided at the center of the rotary table 217 and configured to fix the rotary table 217. Since the core portion 221 supports the rotary table 217, for example, the core portion 221 is made of a metal that can withstand the weight of the rotary table 217. A shaft 222 is provided below the core portion 221. The shaft 222 supports the core portion 221.

A lower portion of the shaft 222 penetrates a hole 223 provided at a bottom of the process vessel 203, and a vessel 204 capable of hermetically sealing the shaft 222 covers a periphery of the lower portion of the shaft 222. The vessel 204 is provided outside the process vessel 203. A lower end of the shaft 222 is connected to a rotator (which is a rotating structure) 224. The rotator 224 is provided with components such as a rotating shaft (not shown) and a motor (not shown), and is configured to rotate the rotary table 217 in accordance with an instruction from a controller 300 described later. That is, the controller 300 controls the rotator 224 to rotate the rotary table 217 about a point located outside the substrate S, that is, around the core portion 221 as an axis, so that the substrate S sequentially passes through the first process region 206a, the first purge region 207a, the second process region 206b and the second purge region 207b in this order.

A quartz cover 225 is provided so as to cover the core portion 221. That is, the quartz cover 225 is provided between the core portion 221 and the process chamber 201. The quartz cover 225 is configured to cover the core portion 221 via a space between the core portion 221 and the process chamber 201. For example, the quartz cover 225 is made of a material such as quartz and SiC such that the substrate S is not affected by the metal contamination. The core portion 221, the shaft 222, the rotator 224 and the quartz cover 225 may be collectively referred to as a "support structure".

According to the present embodiments, inert gas supply structures 500a and 500b serving as a part of a second inert gas supplier 510 described later in detail are provided in a space below the rotary table 217 in the first purge region 207a and a space below the rotary table 217 in the second purge region 207b, respectively. By supplying the inert gas to the spaces below the rotary table 217 in the first purge region 207a and the second purge region 207b though the inert gas supply structures 500a and 500b, it is possible to set (adjust) a pressure of each of those spaces to be higher than a pressure of a space below the rotary table 217 in the first process region 206a and a pressure of a space below the rotary table 217 in the second process region 206b. By purging the spaces described above, it is possible to remove excess gases (undesired gases) below the rotary table 217, and it is also possible to prevent the process gas from entering the adjacent process region 206 (that is, the first process region 206a and the second process region 206b).

A heater structure 281 is provided below the rotary table 217. A plurality of heaters including a heater 280 serving as a heating device are embedded in the heater structure 281. Hereinafter, the plurality of heaters including the heater 280 may also be simply referred to as heaters 280. The heaters 280 are configured to heat the substrates S placed on the rotary table 217, respectively. Each of the heaters 280 is arranged in the circumferential direction in accordance with a shape of the process vessel 203.

The heater structure 281 is constituted mainly by: the inner peripheral convex portion 282 provided on the bottom of the process vessel 203 and on the center portion of the process vessel 203; the outer peripheral convex portion 283 disposed outside the heater 280; and the heater 280. The inner peripheral convex portion 282, the heater 280 and the outer peripheral convex portion 283 are arranged concentrically. A space 284 is provided between the inner peripheral convex portion 282 and the outer peripheral convex portion 283. The heater 280 is disposed in the space 284. Since the inner peripheral convex portion 282 and the outer peripheral convex portion 283 are fixed to the process vessel 203, the inner peripheral convex portion 282 and the outer peripheral convex portion 283 may be considered as a part of the process vessel 203.

While the present embodiments are described by way of an example in which the heater 280 of a circular shape is used, the present embodiments are not limited thereto as long as the substrate S can be heated by the heater 280. For example, the heater 280 may be divided into a plurality of auxiliary heater structures. For example, the heater 280 may be embedded in the rotary table 217.

A flange 282a is provided at an upper portion of the inner peripheral convex portion 282 to face the heater 280. A window 285 is supported on upper surfaces of the flange 282a and the outer peripheral convex portion 283. For example, the window 285 is made of a material capable of transmitting the heat generated by the heater 280 such as quartz. The window 285 is fixed by interposing the window 285 between the inner peripheral convex portion 282 and an upper portion 286a of an exhaust structure 286 described later.

A heater temperature controller 287 is connected to the heater 280. The heater temperature controller 287 is electrically connected to the controller 300 described later, and is configured to control the supply of the electric power to the heater 280 in accordance with an instruction from the controller 300 to perform a temperature control.

An inert gas supply pipe 275 communicating with the space 284 is provided at the bottom of the process vessel 203. The inert gas supply pipe 275 is connected to a third inert gas supplier 270 described later. The inert gas supplied through the third inert gas supplier 270 is supplied to the space 284 through the inert gas supply pipe 275. By setting the space 284 to an inert gas atmosphere, it is possible to prevent the process gas from entering the space 284 through a gap in the vicinity of the window 285.

The exhaust structure 286 made of a metal material is disposed (provided) between an outer peripheral surface of the outer peripheral convex portion 283 and an inner peripheral surface of the process vessel 203. The exhaust structure 286 includes an exhaust groove 288 and an exhaust buffer space 289. Each of the exhaust groove 288 and the exhaust buffer space 289 is arranged in the circumferential direction in accordance with the shape of the process vessel 203.

A portion of the exhaust structure 286 which is not in contact with the outer peripheral convex portion 283 is referred to as the upper portion 286a. As described above, the upper portion 286a is configured to fix the window 285 together with the inner peripheral convex portion 282.

According to the rotary type apparatus (also referred to as a "rotary type substrate processing apparatus") as in the present embodiments, it is preferable that a height of the substrate S is same as or close to a height of an exhaust port described later. When the height of the exhaust port is lower than that of the substrate S, a turbulent flow of the gas may occur at an end portion of the rotary table 217. On the other hand, it is possible to suppress the occurrence of the turbulent flow at edges of the substrate S near the exhaust port by setting the height of the substrate S to be the same as or close to the height of the exhaust port.

According to the present embodiments, an upper end of the exhaust structure 286 is provided at the same height as the rotary table 217. When the upper end of the exhaust structure 286 is provided at the same height as the rotary table 217, as shown in FIG. 2, a protrusion of the upper portion 286a protrudes from the window 285. To prevent particles from diffusing, a quartz cover 290 is provided to cover the protrusion of the upper portion 286a. Without the quartz cover 290, the gas may come into contact with the upper portion 286a, corrode the upper portion 286a and generate the particles in the process chamber 201. A space 299 is provided between the quartz cover 290 and the upper portion 286a.

An exhaust port 291 and an exhaust port 292 are provided at a bottom of the exhaust structure 286. The exhaust port 291 and the exhaust port 292 serve as a first exhaust structure. The source gas supplied into the first process region 206a is mainly exhausted through the exhaust port 291. The reactive gas supplied into the second process region 206b is mainly exhausted through the exhaust port 292. Each of the gases described above is exhausted through the exhaust port 291 and the exhaust port 292 via the exhaust groove 288 and the exhaust buffer space 289.

Subsequently, a source gas supplier (which is a source gas supply structure or a source gas supply system) 240 will be described with reference to FIGS. 1 and 4A. As shown in FIG. 1, a nozzle 245 extending toward the center of the process vessel 203 penetrates a side of the process vessel 203. The nozzle 245 is provided in the first process region 206a. A downstream end of a gas supply pipe 241 is connected to the nozzle 245.

A source gas supply source 242, a mass flow controller (MFC) 243 serving as a flow rate controller (which is a flow rate control structure) and a valve 244 serving as an opening/closing valve are sequentially provided at the gas supply pipe 241 in this order from an upstream side to a downstream side of the gas supply pipe 241.

The source gas is supplied into the first process region 206a through the nozzle 245 via the gas supply pipe 241 provided with the MFC 243 and the valve 244.

The source gas supplier (also referred to as a "first gas supply system" or a "first gas supplier") 240 is constituted mainly by the gas supply pipe 241, the MFC 243, the valve 244 and the nozzle 245. The source gas supplier 240 may further include the source gas supply source 242.

Subsequently, a reactive gas supplier (which is a reactive gas supply structure or a reactive gas supply system) 250 will be described with reference to FIGS. 1 and 4B. As shown in FIG. 1, a nozzle 255 extending toward the center of the process vessel 203 penetrates a side of the process vessel 203. The nozzle 255 is provided in the second process region 206b.

A gas supply pipe 251 is connected to the nozzle 255. A reactive gas supply source 252, an MFC 253 and a valve 254 are sequentially provided at the gas supply pipe 251 in this order from an upstream side to a downstream side of the gas supply pipe 251.

The reactive gas is supplied into the second process region 206b through the nozzle 255 via the gas supply pipe 251 provided with the MFC 253 and the valve 254.

The reactive gas supplier (also referred to as a "second gas supply system" or a "second gas supplier") 250 is constituted mainly by the gas supply pipe 251, the MFC 253, the valve 254 and the nozzle 255. The reactive gas supplier 250 may further include the reactive gas supply source 252.

Subsequently, a first inert gas supplier (which is a first inert gas supply system) 260 will be described with reference to FIGS. 1 and 4C. As shown in FIG. 1, each of a nozzle 265 and a nozzle 266 extending toward the center of the process vessel 203 penetrates a side of the process vessel 203. The nozzle 265 is provided in the first purge region 207a. For example, the nozzle 265 may be fixed to the ceiling 208a of the first purge region 207a. The nozzle 266 is provided in the second purge region 207b. For example, the nozzle 266 may be fixed to the ceiling 208b of the second purge region 207b.

A downstream end of an inert gas supply pipe 261 is connected to the nozzle 265 and the nozzle 266. An inert gas supply source 262, an MFC 263 and a valve 264 are sequentially provided at the inert gas supply pipe 261 in this order from an upstream side to a downstream side of the inert gas supply pipe 261. The inert gas is supplied into the first purge region 207a and the second purge region 207b through the nozzle 265 and the nozzle 266, respectively, via the inert gas supply pipe 261 provided with the MFC 263 and the valve 264. The inert gas supplied into the first purge region 207a and the second purge region 207b serves as a purge gas.

The first inert gas supplier 260 is constituted mainly by the inert gas supply pipe 261, the MFC 263, the valve 264, the nozzle 265 and the nozzle 266. The first inert gas supplier 260 may further include the inert gas supply source 262.

Subsequently, the second inert gas supplier (which is a second inert gas supply system) 510 will be described with reference to FIGS. 1, 2 and 4D. As shown in FIGS. 1 and 2, the inert gas supply structures 500a and 500b are provided in the spaces in the process vessel 203 below the rotary table 217 corresponding to the first purge region 207a and the second purge region 207b, respectively. Each of the inert gas supply structures 500a and 500b extends from near a center of the rotary table 217 toward an outer periphery of the rotary table 217. The inert gas supply structure 500a is provided in the first purge region 207a. The inert gas supply structure 500b is provided in the second purge region 207b. By providing the inert gas supply structures 500a and 500b such that the inert gas can be supplied to the spaces below the rotary table 217 corresponding to the first purge region 207a and the second purge region 207b though the inert gas supply structures 500a and 500b, respectively, it is possible to prevent (or suppress) the process gas from entering a back surface of the rotary table 217 of the first purge region 207a or the second purge region 207b.

A downstream end of an inert gas supply pipe 502 is connected to a side of each of the inert gas supply structures 500a and 500b facing a rotation center of the rotary table 217. An inert gas supply source 504, an MFC 506 and a valve 508 are sequentially provided at the inert gas supply pipe 502 in this order from an upstream side to a downstream side of the inert gas supply pipe 502. The inert gas is supplied into the first purge region 207a and the second purge region 207b through the inert gas supply structure 500a and the inert gas supply structure 500b, respectively, via the inert gas supply pipe 502 provided with the MFC 506 and the valve 508. The inert gas supplied into the first purge region 207a and the second purge region 207b serves as the purge gas.

The second inert gas supplier 510 is constituted mainly by the inert gas supply pipe 502, the MFC 506, the valve 508, the inert gas supply structure 500a and the inert gas supply structure 500b. The second inert gas supplier 510 may further include the inert gas supply source 504.

Subsequently, the third inert gas supplier (which is a third inert gas supply system) 270 will be described with reference to FIGS. 2 and 4E. A downstream end of an inert gas supply pipe 271 is connected to the inert gas supply pipe 275. An inert gas supply source 272, an MFC 273 and a valve 274 are sequentially provided at the inert gas supply pipe 271 in this order from an upstream side to a downstream side of the inert gas supply pipe 271. The inert gas is supplied into the space 284 and the vessel 204 through the inert gas supply pipe 275 via the inert gas supply pipe 271 provided with the MFC 273 and the valve 274.

The inert gas supplied into the vessel 204 is exhausted through the exhaust groove 288 via a space between the rotary table 217 and the window 285. With such a structure, it is possible to prevent the source gas and the reactive gas from flowing into the space between the rotary table 217 and the window 285.

The third inert gas supplier 270 is constituted mainly by the inert gas supply pipe 271, the MFC 273, the valve 274 and the inert gas supply pipe 275. The third inert gas supplier 270 may further include the inert gas supply source 272.

As shown in FIGS. 1 and 2, the exhaust port 291 and the exhaust port 292 are provided at the process vessel 203.

The exhaust port 291 is provided outside the rotary table 217 at a rotationally downstream side of the first process region 206a in the rotation direction "R". Thus, by exhausting (discharging) the source gas thermally decomposed and supplied to the substrate S through the first process region 206a, it is possible to suppress the influence of the thermally decomposed source gas on the substrate S. The source gas is mainly exhausted through the exhaust port 291. An exhaust pipe 234a which is a part of an exhauster (which is an exhaust system) 234 is provided so as to communicate with the exhaust port 291. A vacuum pump 234b serving as a vacuum exhaust device is connected to the exhaust pipe 234a via a valve 234d serving as an opening/closing valve and an APC (Automatic Pressure Controller) valve 234c serving as a pressure regulator (which is a pressure adjusting structure). The vacuum pump 234b is configured to vacuum-exhaust an inner atmosphere of the process chamber 201 such that an inner pressure of the process chamber 201 reaches and is maintained at a predetermined pressure (vacuum degree).

The exhaust pipe 234a, the valve 234d and the APC valve 234c are collectively referred to as the exhauster 234. The exhauster 234 may further include the vacuum pump 234b.

As shown in FIGS. 1 and 2, an exhauster (which is an exhaust system) 235 is provided so as to communicate with the exhaust port 292. The exhaust port 292 is provided outside the rotary table 217 at a rotationally downstream side of the second process region 206b in the rotation direction "R". The reactive gas is mainly exhausted through the exhaust port 292.

An exhaust pipe 235a which is a part of the exhauster 235 is provided so as to communicate with the exhaust port 292. A vacuum pump 235b is connected to the exhaust pipe 235a via a valve 235d and an APC valve 235c. The vacuum pump 235b is configured to vacuum-exhaust the inner atmosphere of the process chamber 201 such that the inner pressure of the process chamber 201 reaches and is maintained at a predetermined pressure (vacuum degree).

The exhaust pipe 235a, the valve 235d and the APC valve 235c are collectively referred to as the exhauster 235. The exhauster 235 may further include the vacuum pump 235b.

Subsequently, the first purge region 207a and the second purge region 207b will be described with reference to FIGS. 1, 2, 5A, 5B, 6A and 6B.

As described above, the inert gas supply structures 500a and 500b are provided in the spaces below the rotary table 217 in the first purge region 207a and the second purge region 207b, respectively. Since a configuration of the second purge region 207b is the same as that of the first purge region 207a and a configuration of the inert gas supply structure 500b is the same as that of the inert gas supply structure 500a, the description thereof will be omitted.

Figure 5A:
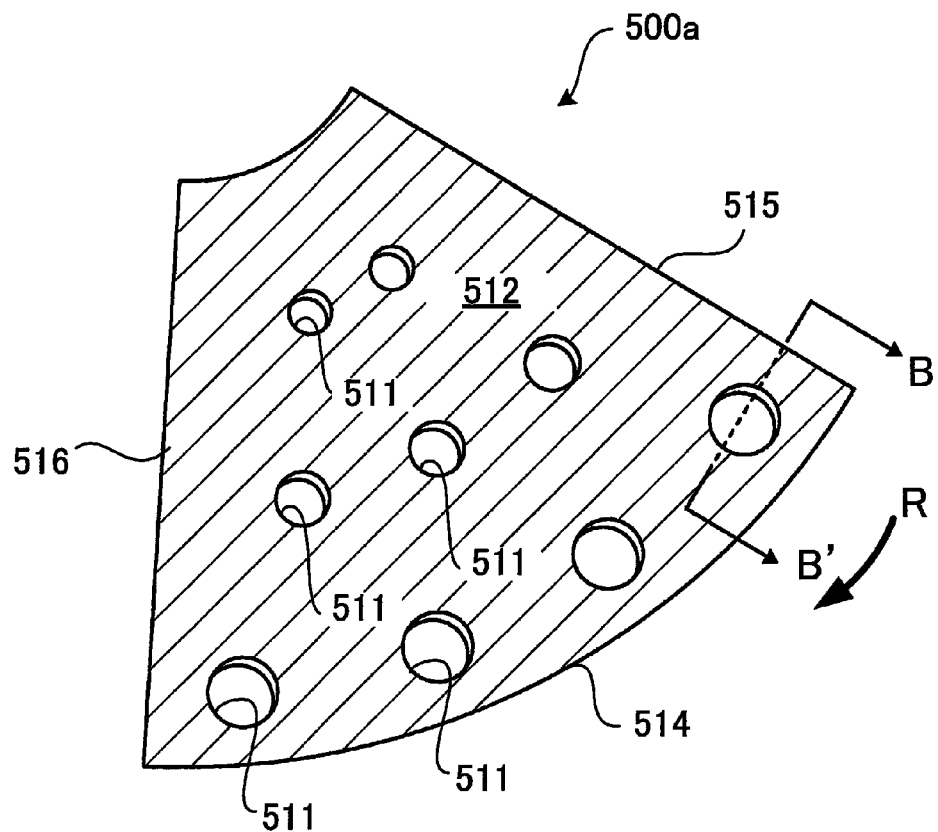
FIG. 5A is a diagram schematically illustrating an inert gas supply structure according to the embodiments described herein when viewed from above.
Figure 5B:
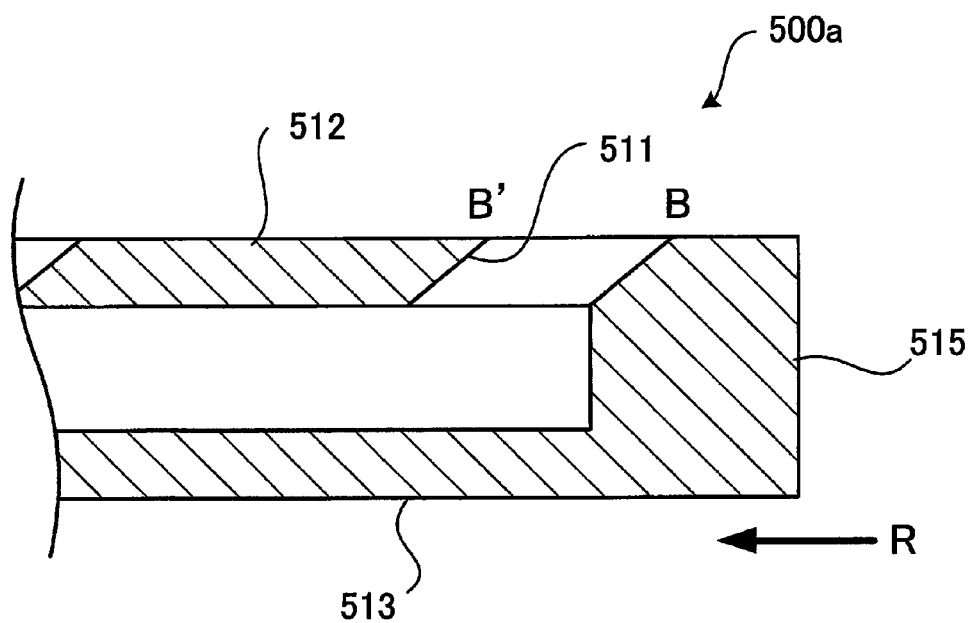
FIG. 5B is a diagram schematically illustrating a cross-section taken along the line B-B' of the inert gas supply structure shown in FIG. 5A.

FIG. 5A is a diagram schematically illustrating the inert gas supply structure 500a when viewed from above, and FIG. 5B is a diagram schematically illustrating a cross-section of the inert gas supply structure 500a taken along the line B-B' shown in FIG. 5A.

The inert gas supply structure 500a is configured to expand in a radial direction from one side thereof facing the rotation center of the rotary table 217 to the other side thereof facing an outer periphery of the rotary table 217 below the back surface of the rotary table 217, and is configured as a fan shape or a trapezoidal shape in accordance with a shape of the first purge region 207a in the process vessel 203. Hereinafter, the side of the inert gas supply structure 500a facing the rotation center of the rotary table 217 may also be simply referred to as a "rotation center side of the inert gas supply structure 500a", and the other side of the inert gas supply structure 500a facing the outer periphery of the rotary table 217 may also be simply referred to as an "outer peripheral side of the inert gas supply structure 500a". A plurality of gas supply holes 511 are provided on an upper surface of the inert gas supply structure 500a facing the back surface of the rotary table 217.

Further, the downstream end of the inert gas supply pipe 502 is connected to the rotation center side of the inert gas supply structure 500a below the back surface of the rotary table 217. The inert gas is supplied from the rotation center side of the inert gas supply structure 500a below the back surface of the rotary table 217 toward the outer peripheral side of the inert gas supply structure 500a below the back surface of the rotary table 217 via the inert gas supply pipe 502.

Specifically, the inert gas supply structure 500a may include: a fan-shaped or trapezoidal upper surface portion 512 which is of substantially the same shape as the first purge region 207a; a lower surface portion 513 facing the upper surface portion 512; an outer peripheral surface portion 514 connecting circumferential surfaces of the upper surface portion 512 with the lower surface portion 513; a side surface portion 515 connecting radial surfaces of the upper surface portion 512 with the lower surface portion 513 on an upstream side of the rotary table 217 in the rotation direction "R"; and a side surface portion 516 connecting radial surfaces of the upper surface portion 512 with the lower surface portion 513 on a downstream side of the rotary table 217 in the rotation direction "R". The downstream end of the inert gas supply pipe 502 is connected to the rotation center side of the inert gas supply structure 500a below the back surface of the rotary table 217.

The plurality of gas supply holes 511 are provided in the upper surface portion 512. An opening area of each of the gas supply holes 511 may gradually increase from an inner periphery toward an outer periphery of the upper surface portion 512. That is, the plurality of gas supply holes 511 are configured such that a hole diameter of a gas supply hole among the plurality of gas supply holes 511 provided adjacent to the outer peripheral side of the inert gas supply structure 500a below the back surface of the rotary table 217 is greater than a hole diameter of a gas supply hole among the plurality of gas supply holes 511 provided adjacent to the rotation center side of the inert gas supply structure 500a below the back surface of the rotary table 217. Thereby, it possible to increase a flow rate of the inert gas on the outer peripheral side of the inert gas supply structure 500a below the back surface of the rotary table 217.

That is, the inert gas supply structure 500a is configured such that the flow rate of the inert gas supplied through the outer peripheral side of the inert gas supply structure 500a below the back surface of the rotary table 217 is different from the flow rate of the inert gas supplied through the rotation center side of the inert gas supply structure 500a below the back surface of the rotary table 217. In other words, the inert gas supply structure 500a is configured such that the flow rate of the inert gas supplied toward the outer periphery of the rotary table 217 on the back surface of the rotary table 217 is different from the flow rate of the inert gas supplied toward a portion of the rotary table 217 on the back surface of the rotary table 217 adjacent to the center (rotation center) of the rotary table 217. Further, the inert gas supply structure 500a may be configured such that the flow rate of the inert gas supplied through the outer peripheral side of the inert gas supply structure 500a below the back surface of the rotary table 217 is greater than the flow rate of the inert gas supplied through the rotation center side of the inert gas supply structure 500*a* below the back surface of the rotary table 217.

Since the process gas is supplied from the outer periphery of the rotary table 217, a concentration of the process gas on the outer periphery of the rotary table 217 is higher than that of the process gas on a portion adjacent to the rotation center of the rotary table 217. By configuring the flow rate of the inert gas supplied through the outer peripheral side of the inert gas supply structure 500*a* below the back surface of the rotary table 217 to be higher than the flow rate of the inert gas supplied through the rotation center side of the inert gas supply structure 500*a* below the back surface of the rotary table 217, it is possible to suppress a flow of the process gas to the back surface of the rotary table 217 in a radial direction of the rotary table 217, and it is also possible to prevent (or suppress) the process gas from flowing to the back surface of the rotary table 217.

As shown in FIG. 5B, the plurality of gas supply holes 511 are provided so as to be opened and inclined in a direction opposite to the rotation direction "R" (also referred to as a "transport direction" of the substrate S) of the rotary table 217. As a result, the inert gas supply structure 500*a* is configured to supply the inert gas in the direction opposite to the rotation direction "R" of the rotary table 217. By supplying the inert gas in the direction opposite to the rotation direction "R" of the rotary table 217 as described above, it is possible to prevent (or suppress) the process gas from flowing in the rotation direction "R" of the rotary table 217. In addition, it is possible to purge the process gas adhering to the back surface of the rotary table 217. It is also possible to prevent (or suppress) the process gas from adhering to the back surface of the rotary table 217 and moving in accordance with the rotation of the rotary table 217.

That is, by providing the inert gas supply structures 500*a* and 500*b* in the spaces below the rotary table 217 corresponding to the first purge region 207*a* and the second purge region 207*b*, respectively and by supplying the inert gas to the spaces below the rotary table 217, it is possible to set (or adjust) the pressure of the space below the rotary table 217 in the first purge region 207*a* and the pressure of the space below the rotary table 217 in the second purge region 207*b* to be higher than the pressure of the space below the rotary table 217 in the first process region 206*a* and the pressure of the space below the rotary table 217 in the second process region 206*b*. As a result, it is possible to prevent (or suppress) the process gas from flowing to the back surface of the rotary table 217 in the first purge region 207*a* and the second purge region 207*b*.

As shown in FIGS. 1 and 2, protrusions 600*a* and 600*b* protruding toward the center of the process vessel 203 are provided on an inner wall of the process vessel 203 of the first purge region 207*a* and the second purge region 207*b*, respectively. The protrusions 600*a* and 600*b* are provided on the inner wall of the process vessel 203 outside the rotary table 217. The protrusions 600*a* and 600*b* are arranged in the circumferential direction in accordance with the shape of the process vessel 203. Further, the protrusions 600*a* and 600*b* are provided obliquely upward of a side of the rotary table 217. The protrusions 600*a* and 600*b* are configured to face outer peripheral surfaces of the ceilings 208*a* and 208*b*, respectively. By providing the protrusions 600*a* and 600*b* as described above, it is possible to prevent (or suppress) the process gas from flowing to the first purge region 207*a* and the second purge region 207*b* from above the rotary table 217.

Figure 6A:
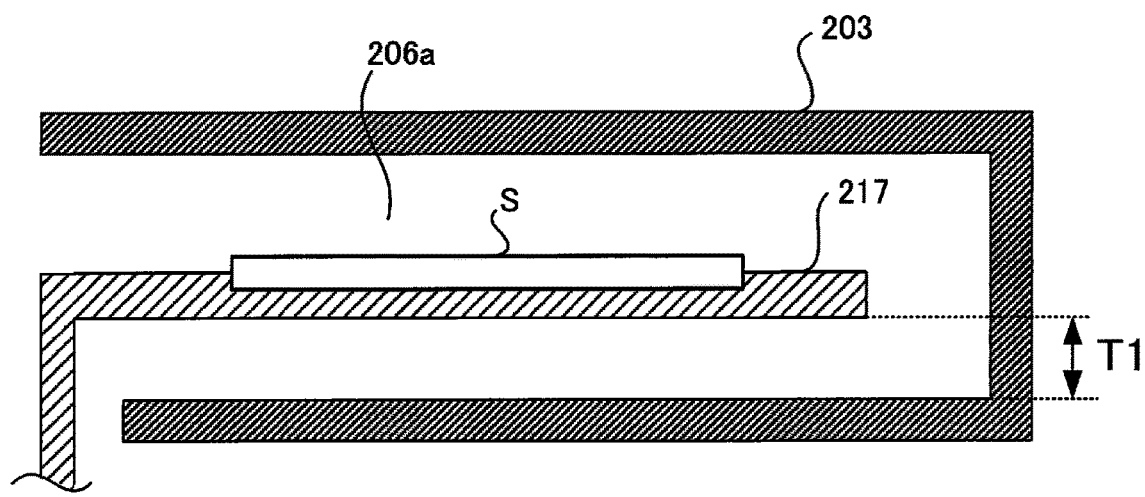
FIG. 6A is a diagram schematically illustrating a vertical cross-section of the reactor for describing a process region according to the embodiments described herein.
Figure 6B:
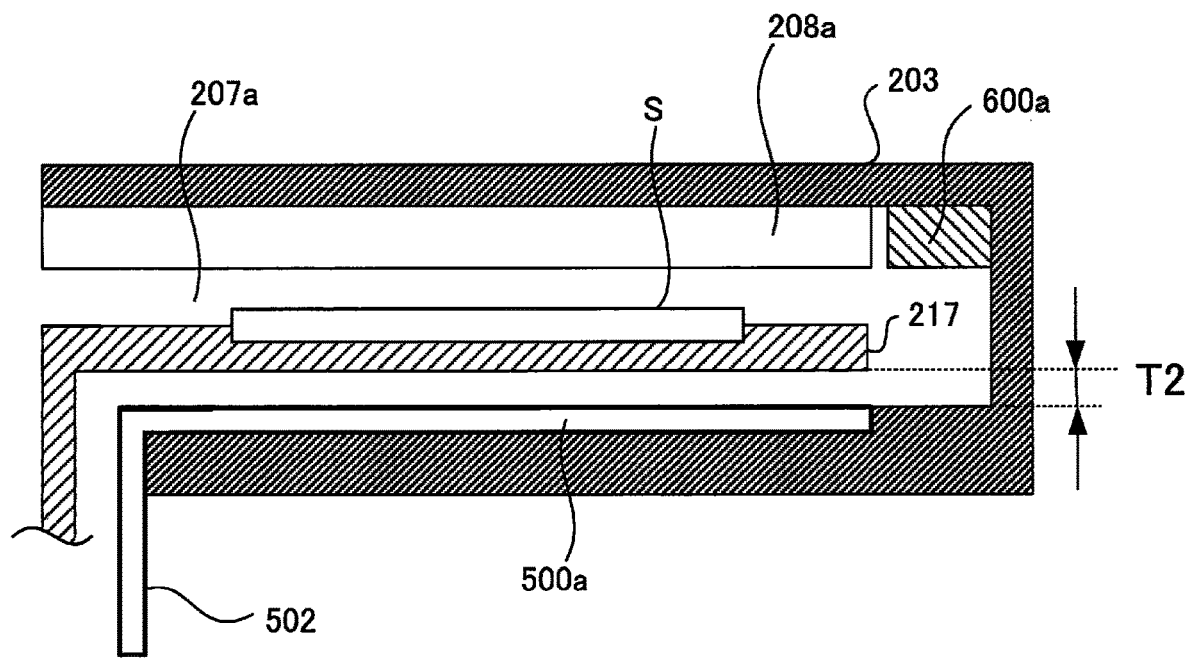
FIG. 6B is a diagram schematically illustrating a vertical cross-section of the reactor for describing a purge region according to the embodiments described herein.

FIG. 6A is a diagram schematically illustrating a vertical cross-section of the process vessel 203 for describing the first process region 206*a*, and FIG. 6B is a diagram schematically illustrating a vertical cross-section of the process vessel 203 for describing the first purge region 207*a*.

As shown in FIGS. 6A and 6B, a distance T2 between the back surface of the rotary table 217 in the first purge region 207*a* and a bottom surface of the process vessel 203 is set to be shorter (that is, narrow spaced) than a distance T1 between the back surface of the rotary table 217 in the first process region 206*a* and the bottom surface of the process vessel 203.

By setting the distances T1 and T2 as described above, it is possible to set (or adjust) the pressure of the space below the rotary table 217 in the first purge region 207*a* to be higher than the pressure of the space below the rotary table 217 in the first process region 206*a*. In other words, it is possible to set (or adjust) a conductance of the space below the rotary table 217 in the first purge region 207*a* to be lower than a conductance of the space below the rotary table 217 in the first process region 206*a*. Thereby, it is possible to suppress the flow of the process gas from the first process region 206*a* to the first purge region 207*a*. Similarly, it is possible to suppress the flow of the process gas from the second process region 206*b* to the second purge region 207*b*.

Figure 7:
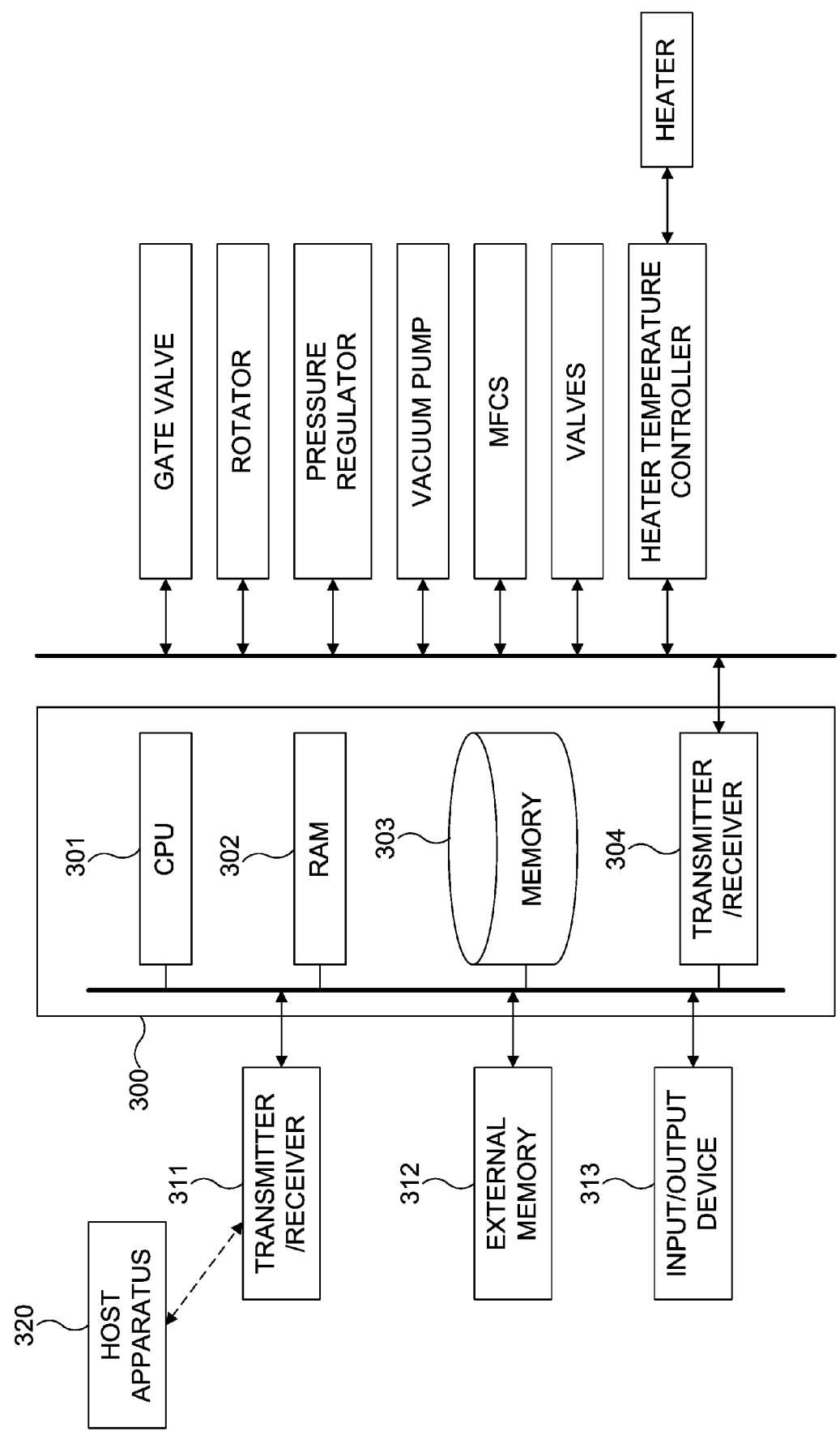
FIG. 7 is a block diagram schematically illustrating a configuration of a controller and related components of the substrate processing apparatus according to the embodiments described herein.

The reactor 200 includes the controller 300 configured to control the operations of the components of the substrate processing apparatus. As shown in FIG. 7, the controller 300 includes at least a CPU (Central Processing Unit) 301 serving as an arithmetic unit, a RAM (Random Access Memory) 302 serving as a temporary memory, a memory 303 and a transmitter/receiver 304. The controller 300 is connected to the components of the substrate processing apparatus via the transmitter/receiver 304, calls a program or a recipe from the memory 303 in accordance with an instruction from a host controller or a user, and controls the operations of the components of the substrate processing apparatus according to the contents of the instruction. The controller 300 may be embodied by a dedicated computer or by a general-purpose computer. According to the present embodiments, for example, the controller 300 may be embodied by preparing an external memory 312 storing the program and by installing the program onto the general-purpose computer using the external memory 312. For example, the external memory 312 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. The method of providing the program to the computer is not limited to the external memory 312. For example, the program may be supplied to the computer (general-purpose computer) using communication means such as the Internet and a dedicated line. The program may be provided to the computer without using the external memory 312 by receiving the information (that is, the program) from a host apparatus 320 via a transmitter/receiver 311. In addition, a user can input an instruction to the controller 300 using an input/output device 313 such as a keyboard and a touch panel.

The memory 303 or the external memory 312 may be embodied by a non-transitory computer readable recording medium. Hereafter, the memory 303 and the external memory 312 may be collectively or individually referred to as the recording medium. In the present specification, the term "recording medium" may refer to the memory 303 alone, may refer to the external memory 312 alone or may refer to both of the memory 303 and the external memory 312.

The CPU 301 is configured to read a control program from the memory 303 and execute the read control program. Furthermore, the CPU 301 is configured to read the recipe such as a process recipe from the memory 303 according to an operation command inputted from the input/output device 313. According to the contents of the read recipe, the CPU 301 may be configured to control the operations of the components of the substrate processing apparatus.

(2) Substrate Processing

Subsequently, the substrate processing according to the present embodiments will be described with reference to FIGS. 8 and 9. FIG. 8 is a flow chart schematically illustrating the substrate processing according to the present embodiments. FIG. 9 is a flow chart schematically illustrating a film-forming step of the substrate processing according to the present embodiments. In the following description, the operations of the components of the reactor 200 of the substrate processing apparatus are controlled by the controller 300.

A substrate loading and placing step S110 will be described. In the reactor 200, the pins 219 are elevated such that the pins 219 pass through the through-holes 217a of the rotary table 217. As a result, the pins 219 protrude from the surface of the rotary table 217 by a predetermined height. Subsequently, the gate valve 205 is opened, and the substrate S is placed on the pins 219 as shown in FIG. 3 by using a substrate transfer device (not shown). After the substrate S is placed on the pins 219, by lowering the pins 219, the substrate S is placed on one of the concave portions 217b.

The rotary table 217 is rotated until one of the concave portions 217b, where the substrate S is not placed, faces the gate valve 205. Thereafter, one of the substrates S is placed on the above-mentioned one of the concave portions 217b. An operation described above is repeatedly performed until the substrates S are placed on the entirety of the concave portions 217b.

After the substrates S are placed on the entirety of the concave portions 217b, the substrate transfer device is retracted out of the reactor 200, and the gate valve 205 is closed to seal the process vessel 203.

When the substrates S are loaded into the process chamber 201, it is preferable that the inert gas is supplied into the process chamber 201 by the first inert gas supplier 260 while exhausting the process chamber 201 by the exhausters 234 and 235. Thereby, it is possible to suppress the particles from entering the process chamber 201 and from adhering onto the substrates S. The vacuum pumps 234b and 235b may be continuously operated from the substrate loading and placing step S110 until at least a substrate unloading step S170 described later is completed.

When the substrate S is placed on the rotary table 217, the electric power is supplied to the heater 280 in advance such that a temperature (surface temperature) of the substrate S is adjusted to a predetermined temperature. For example, the predetermined temperature of the substrate S according to the present embodiments may range from the room temperature to 650° C., preferably from the room temperature to 400° C. The electric power may be continuously supplied to the heater 280 from the substrate loading and placing step S110 until at least the substrate unloading step S170 described later is completed.

In the substrate loading and placing step S110, the inert gas is supplied to the spaces below the rotary table 217 by the second inert gas supplier 510. As a result, it is possible to prevent (or suppress) the process gas from being adsorbed to the back surface of the rotary table 217, and to suppress the accumulation of deposits generated by chemical reaction between the precursor and a reactant caused by the adsorption of the process gas. It is also possible to suppress the generation of the particles. Thereby, it is possible to prevent (or suppress) the particles from adhering to the substrate S.

In the substrate loading and placing step S110, the inert gas is supplied to the process vessel 203 and the heater structure 281 by the third inert gas supplier 270.

The inert gas may be continuously supplied from the substrate loading and placing step S110 until at least the substrate unloading step S170 described later is completed.

A step S120 of starting the rotation of the rotary table 217 will be described. After the substrates S are placed on the entirety of the concave portions 217b, the controller 300 controls the rotator 224 to rotate the rotary table 217 in the "R" direction shown in FIG. 1. By rotating the rotary table 217, the substrate S is moved to the first process region 206a, the first purge region 207a, the second process region 206b and the second purge region 207b sequentially in this order.

A step S130 of starting the supply of the gas will be described. When the substrate S is heated to a desired temperature and a rotation speed of the rotary table 217 reaches and is maintained at a desired rotation speed, the valve 244 is opened to start the supply of the source gas into the first process region 206a. In parallel with the supply of the source gas, the valve 254 is opened to supply the reactive gas into the second process region 206b.

In the step S130, a flow rate of the source gas is adjusted by the MFC 243 to a predetermined flow rate. For example, the predetermined flow rate of the source gas in the step S130 may range from 50 sccm to 500 sccm.

In the step S130, a flow rate of the reactive gas is adjusted by the MFC 253 to a predetermined flow rate. For example, the predetermined flow rate of the reactive gas in the step S130 may range from 100 sccm to 5,000 sccm.

In the present specification, the source gas described above is one of process gases, and serves as a source when a film is formed. The source gas contains at least one element constituting the film. For example, the source gas contains at least one element among silicon (Si), titanium (Ti), tantalum (Ta), hafnium (Hf), zirconium (Zr), ruthenium (Ru), nickel (Ni), tungsten (W) and molybdenum (Mo).

When a source of the source gas is a gaseous state under the normal temperature (room temperature), a gas mass flow controller is used as the MFC 243.

In the present specification, the reactive gas described above is one of the process gases, and refers to a gas that reacts with a first layer formed on the substrate S by supplying the source gas. For example, the reactive gas may include at least one among ammonia ($NH_3$) gas, nitrogen ($N_2$) gas, hydrogen ($H_2$) gas and oxygen ($O_2$) gas. Specifically, according to the present embodiments, for example, the $NH_3$ gas may be used as the reactive gas.

In the present specification, for example, the inert gas may include at least one among nitrogen ($N_2$) gas and a rare gas such as helium (He) gas, neon (Ne) gas and argon (Ar) gas. Specifically, according to the present embodiments, for example, the $N_2$ gas may be used as the inert gas.

The substrate processing according to the present embodiments will be described by way of an example in which a silicon nitride (SiN) film serving as the film is formed on the substrate S by using the dichlorosilane ($Si_2H_2Cl_2$) gas as the source gas and the $NH_3$ gas as the reactive gas.

In addition, after the substrate loading and placing step S110, the process chamber 201 is exhausted by the exhausters 234 and 235 and the $N_2$ gas serving as the purge gas is supplied into the first purge region 207a and the second purge region 207b through the first inert gas supplier 260 and the second inert gas supplier 510. In addition, by appropriately adjusting opening degrees of the APC valve 234c and the APC valve 235c, the inner pressure of the process chamber 201 is adjusted to a predetermined pressure.

A film-forming step S140 will be described. Here, a basic flow of the film-forming step S140 will be described, and the film-forming step S140 will be described in detail later. In the film-forming step S140, a silicon-containing layer is formed on the substrate S in the first process region 206a. After the substrate S is rotated to the second process region 206b, by reacting the silicon-containing layer with the $NH_3$ gas in the second process region 206b, the silicon nitride (SiN) film is formed on the substrate S. The rotary table 217 is rotated a predetermined number of times so that the SiN film of a desired thickness is obtained.

A step S150 of stopping the supply of the gas will be described. After the rotary table 217 is rotated the predetermined number of times, the valve 244 is closed to stop the supply of the $Si_2H_2Cl_2$ gas to the first process region 206a and the valve 254 is closed to stop the supply of the $NH_3$ gas to the second process region 206b.

A step S160 of stopping the rotation of the rotary table 217 will be described. After the supply of the $Si_2H_2Cl_2$ gas and the supply of the $NH_3$ gas are stopped according to the step S150, the rotation of the rotary table 217 is stopped in the step S160.

The substrate unloading step S170 will be described. The rotary table 217 is rotated to move the substrate S to the position facing the gate valve 205. Thereafter, the substrate S is supported on the pins 219 in the same manner as when the substrate S is loaded. After the substrate S is supported on the pins 219, the gate valve 205 is opened, and the substrate S is unloaded (transferred) out of the process vessel 203 using the substrate transfer device (not shown). An operation described above is repeated until the entirety of the substrates S are unloaded out of the process vessel 203. After the entirety of the substrates S are unloaded, the supply of the inert gas by the second inert gas supplier 510 and the third inert gas supplier 270 is stopped.

Subsequently, the film-forming step S140 will be described in detail with reference to FIG. 9. The film-forming step S140 will be mainly described based on the substrate S among the substrates S placed on the rotary table 217 from a first process region passing step S210 to a second purge region passing step S240.

As shown in FIG. 9, during the film-forming step S140, the substrates S pass through the first process region 206a, the first purge region 207a, the second process region 206b and the second purge region 207b sequentially in this order as the rotary table 217 is rotated.

The first process region passing step S210 will be described. As the substrate S passes through the first process region 206a, the $Si_2H_2Cl_2$ gas serving as the source gas (process gas) is supplied to the substrate S. When the substrate S passes through the first process region 206a, since there is no reactive gas in the first process region 206a, the $Si_2H_2Cl_2$ gas directly contacts (adheres to) the surface of the substrate S without reacting with the reactive gas. Thereby, the first layer is formed on the surface of the substrate S.

A first purge region passing step S220 will be described. After passing through the first process region 206a, the substrate S moves to the first purge region 207a. When the substrate S passes through the first purge region 207a, by supplying the $N_2$ gas serving as the inert gas to the substrate S, components of the $Si_2H_2Cl_2$ gas which are not strongly adhered to the substrate S in the first process region 206a are removed from the substrate S by the inert gas.

A second process region passing step S230 will be described. After passing through the first purge region 207a, the substrate S moves to the second process region 206b. When the substrate S passes through the second process region 206b, by supplying the $NH_3$ gas serving as the reactive gas (process gas) to the substrate S, the first layer reacts with the $NH_3$ gas serving as the reactive gas in the second process region 206b. Thereby, a second layer containing at least silicon (Si) and nitrogen (N) is formed on the substrate S.

The second purge region passing step S240 will be described. After passing through the second process region 206b, the substrate S moves to the second purge region 207b. When the substrate S passes through the second purge region 207b, by supplying the $N_2$ gas serving as the inert gas to the substrate S, gases such as HCl desorbed from the second layer on the substrate S in the second process region 206b and surplus $H_2$ gas are removed from the substrate S by the inert gas.

As described above, at least two gases reacting with each other are sequentially supplied to the substrate S. A cycle of the present embodiments includes the first process region passing step S210, the first purge region passing step S220, the second process region passing step S230 and the second purge region passing step S240.

A determination step S250 will be described. In the determination step S250, the controller 300 determines whether the cycle including the first process region passing step S210, the first purge region passing step S220, the second process region passing step S230 and the second purge region passing step S240 has been performed a predetermined number of times. Specifically, the controller 300 counts the number of the rotation of the rotary table 217.

When the cycle has not been performed the predetermined number of times ("NO" in the step S250 of FIG. 9), the rotary table 217 is continuously rotated and the cycle including the first process region passing step S210, the first purge region passing step S220, the second process region passing step S230 and the second purge region passing step S240 is repeatedly performed. By performing the cycle the predetermined number of times, it is possible to form the film on the substrate S.

When the cycle has been performed the predetermined number of times ("YES" in the step S250 of FIG. 9), the film-forming step S140 is terminated. As described above, it is possible to form the film on the substrate S with a predetermined thickness by performing the cycle the predetermined number of times.

(3) Effects According to Present Embodiments

According to the present embodiments described above, it is possible to provide one or more of the following effects.
 (a) It is possible to reduce the amount of the deposits on the back surface of the rotary table 217.

(b) It is possible to suppress the generation of the particles.
(c) It is possible to prevent (or suppress) the particles from adhering to the substrate S.
(d) It is possible to prevent (or suppress) the process gas from entering the purge region 207.

Other Embodiments

While the technique of the present disclosure is described in detail by way of the embodiments described above, the above-described technique is not limited thereto. The above-described technique may be modified in various ways without departing from the scope thereof.

For example, the above-described embodiments are described by way of an example in which the nozzles 265 and 266 through which the inert gas is supplied into the first purge region 207a and the second purge region 207b are fixed to the ceilings 208a and 208b, respectively. However, the above-described technique is not limited thereto. For example, the above-described technique may be preferably applied when inert gas supply passages through which the inert gas is supplied are provided on the ceilings 208a and 208b, respectively, and the inert gas is supplied into the first purge region 207a and the second purge region 207b through the inert gas supply passages, respectively. When the inert gas supply passages are provided, the protrusions 600a and 600b are provided to face the outer peripheral surfaces of the ceilings 208a and 208b serving as a part of an inert gas supplier configured to supply the inert gas to the first purge region 207a and the second purge region 207b. Thereby, it is possible to prevent (or suppress) the process gas from flowing to the first purge region 207a and the second purge region 207b from above the rotary table 217.

For example, the above-described embodiments are described by way of an example in which the film-forming step serving as a part of the manufacturing processes of the semiconductor device is performed. However, the above-described technique is not limited thereto and may be applied to other processes. For example, the above-described technique may be preferably applied to a step of performing a heat treatment process or a plasma treatment process on the substrate for each cycle. By applying the above-described technique, it is possible to efficiently remove the by-products generated in a groove and a gas (molecules) desorbed from a film already formed on the substrate. In addition, the above-described technique is not limited to the processes described above. For example, the above-described technique may be applied to a process of etching each atomic layer (molecular layer) of the film formed on the substrate. By purging an etching gas as described above, it is possible to efficiently remove substances such as the by-products in the groove generated by etching and the etching gas present in the groove.

According to some embodiments of the technique in the present disclosure, it is possible to reduce the amount of the deposits on the back surface of the rotary table.

What is claimed is:
1. A substrate processing apparatus comprising:
a process chamber in which a substrate is processed, provided with a first region in which a process gas is supplied to the substrate and a second region in which a first inert gas supplier configured to supply an inert gas to the substrate is provided;
a rotary table configured to rotate the substrate accommodated in the process chamber about a point located outside the substrate such that the substrate sequentially passes through the first region and the second region;
a rotator configured to rotate the rotary table; and
a second inert gas supplier provided within a space below a portion of the rotary table in the second region and configured to supply the inert gas to the space below the portion of the rotary table in the second region,
wherein the space below the portion of the rotary table in the second region is configured such that a pressure of the space below the portion of the rotary table in the second region is higher than a pressure of a space below a portion of the rotary table in the first region.

2. The substrate processing apparatus of claim 1, wherein the second inert gas supplier is further configured to supply the inert gas in a direction opposite to a rotation direction of the rotary table.

3. The substrate processing apparatus of claim 1, wherein the second inert gas supplier is provided with a plurality of inert gas supply holes opened toward a direction opposite to a rotation direction of the rotary table.

4. The substrate processing apparatus of claim 2, wherein the second inert gas supplier is provided with a plurality of inert gas supply holes opened toward the direction opposite to the rotation direction of the rotary table.

5. The substrate processing apparatus of claim 1, wherein the second inert gas supplier is further configured such that a flow rate of the inert gas supplied toward an outer periphery of a back surface of the rotary table is different from a flow rate of the inert gas supplied toward a center of the back surface of the rotary table.

6. The substrate processing apparatus of claim 2, wherein the second inert gas supplier is further configured such that a flow rate of the inert gas supplied toward an outer periphery of a back surface of the rotary table is different from a flow rate of the inert gas supplied toward a center of the back surface of the rotary table.

7. The substrate processing apparatus of claim 3, wherein the second inert gas supplier is further configured such that a flow rate of the inert gas supplied toward an outer periphery of a back surface of the rotary table is different from a flow rate of the inert gas supplied toward a center of the back surface of the rotary table.

8. The substrate processing apparatus of claim 1, wherein the second inert gas supplier is further configured such that a flow rate of the inert gas supplied toward an outer periphery of a back surface of the rotary table is higher than a flow rate of the inert gas supplied toward a center of the back surface of the rotary table.

9. The substrate processing apparatus of claim 2, wherein the second inert gas supplier is further configured such that a flow rate of the inert gas supplied toward an outer periphery of a back surface of the rotary table is higher than a flow rate of the inert gas supplied toward a center of the back surface of the rotary table.

10. The substrate processing apparatus of claim 3, wherein the second inert gas supplier is further configured such that a flow rate of the inert gas supplied toward an outer periphery of a back surface of the rotary table is higher than a flow rate of the inert gas supplied toward a center of the back surface of the rotary table.

11. The substrate processing apparatus of claim 5, wherein the second inert gas supplier is further configured such that the flow rate of the inert gas supplied toward the outer periphery of the back surface of the rotary table is higher than the flow rate of the inert gas supplied toward the center of the back surface of the rotary table.

12. The substrate processing apparatus of claim 8, wherein the second inert gas supplier is provided with a plurality of gas supply holes, and the plurality of gas supply holes are provided such that a hole diameter of a gas supply hole among the plurality of gas supply holes facing the outer periphery of the back surface of the rotary table is greater than a hole diameter of a gas supply hole among the plurality of gas supply holes facing the center of the back surface of the rotary table.

13. The substrate processing apparatus of claim 1, further comprising a protrusion provided on an inner wall of a process vessel in the second region and obliquely upward of the rotary table so as to protrude toward a center of the process vessel.

14. The substrate processing apparatus of claim 13, wherein the protrusion is configured to face an outer peripheral surface of the second inert gas supplier configured to supply the inert gas to the second region.

15. The substrate processing apparatus of claim 1, wherein a distance between a back surface of the rotary table corresponding to the second region and a bottom surface of a process vessel is shorter than a distance between a back surface of the rotary table corresponding to the first region and the bottom surface of the process vessel.

16. The substrate processing apparatus of claim 1, wherein
the first region comprises a first process region in which a source gas serving as the process gas is supplied to the substrate and a second process region in which a reactive gas serving as the process gas is supplied to the substrate,
the second region comprises a first purge region in which the inert gas is supplied to the substrate and a second purge region in which the inert gas is supplied to the substrate, and
the first process region, the first purge region, the second process region, and the second purge region are sequentially arranged in this order along a circumferential direction of the process chamber.

17. The substrate processing apparatus of claim 1, further comprising:
an exhaust port provided outside the rotary table at a rotationally downstream side of the first region in a rotation direction of the rotary table.

* * * * *